United States Patent [19]

Nelson et al.

[11] Patent Number: 4,691,174
[45] Date of Patent: Sep. 1, 1987

[54] FAST RECOVERY AMPLIFIER

[75] Inventors: Theodore G. Nelson, Beaverton; Calvin D. Diller, Hillsboro, both of Oreg.

[73] Assignee: Tektronix, Inc., Beaverton, Oreg.

[21] Appl. No.: 909,437

[22] Filed: Sep. 19, 1986

[51] Int. Cl.⁴ ............................................. H03F 3/45
[52] U.S. Cl. .................................... 330/260; 307/300
[58] Field of Search ............... 330/252, 259, 260, 261; 307/300

[56] References Cited

U.S. PATENT DOCUMENTS 4,528,515  7/1985  Gross .............................. 330/261 X

*Primary Examiner*—James B. Mullins
*Attorney, Agent, or Firm*—John P. Dellett

[57] ABSTRACT

An amplifier includes first and second transistors having emitters connected to a first current source, feedback from the second transistor collector to its base being supplied through a base-emitter path of a first Darlington pair in series with a first diode. A second current source is connected to the first Darlington pair emitter. Third and fourth transistors have emitters connected to a third current source with feedback supplied from the fourth transistor collector to its base through a second Darlington pair and a second diode. The second Darlington pair emitter is connected to a fourth current source and resistively coupled to the first Darlington pair emitter. Constant currents are supplied to the second and fourth transistor collectors and an input voltage across the first and third transistor bases controls allocation of current between the first and second Darlington pair emitter-collector paths to produce a differential output current proportional to the input voltage when both Darlington pairs are on. When the input voltage is highly negative, the first Darlington pair turns off and a biasing circuit reverse biases the first diode to prevent the second transistor from saturating and substantially discharging capacitance at the base of the first Darlington pair. Thus, the first Darlington pair can rapidly turn on when the input voltage is subsequently driven more positive. When the input voltage is highly positive, another biasing circuit reverse biases the second diode to prevent the fourth transistor from saturating.

15 Claims, 8 Drawing Figures

FAST RECOVERY AMPLIFIER

BACKGROUND OF THE INVENTION

The present invention relates to differential amplifiers in general, and in particular to a differential amplifier which recovers rapidly from an overdriven state to a linear operating state.

A typical transistor-based differential amplifier produces a differential output signal which varies in a substantially linear fashion with a differential input signal over its normal operating range. However, when the input signal becomes too large in either a positive or negative sense, the amplifier becomes "overdriven" such that base-emitter voltages of transistors in the differential amplifier are driven outside a range for which the transistors are active, and such transistors may saturate or shut off. When a transistor saturates or shuts off, the charge on inherent circuit capacitance at the base of the transistor may increase or decrease substantially, and in order for the transistor to recover from a saturated or shut off state to an active state, its base capacitance must be appropriately charged or discharged. Consequently, to permit a differential amplifier to recover from an overdriven state, the input signal magnitude must be reduced to within its normal range and the capacitances at the bases of saturated or shut off transistors in the amplifier must be charged or discharged by an amount sufficient to permit the transistors to enter their active regions. Since the charging or discharging of these capacitances is time consuming, there is a delay between the time the input signal re-enters the range for which the amplifier normally responds to the input signal in a linear fashion and the time the amplifier actually begins to respond to the input signal in a linear fashion. What is needed is a differential amplifier which recovers to a linear operating state from an overdriven state with minimal delay.

SUMMARY OF THE INVENTION

A differential amplifier includes first and second transistors having emitters connected to a first current source. Feedback current is supplied to the base of the second transistor from its collector through the base-emitter path of a first Darlington pair, and in reverse direction through a first diode connecting the emitter of the first Darlington pair to the second transistor base. A second current source is connected to the emitter of the first Darlington pair. The differential amplifier also includes third and fourth transistors having emitters connected to a third current source, feedback current being supplied to the base of the fourth transistor from its collector through the base-emitter path of a second Darlington transistor pair and a second diode connecting the emitter of the second Darlington pair to the base of the fourth transistor. A fourth current source is connected to the emitter of the second Darlington pair and the emitters of the first and second Darlington pairs are resistively coupled. The first and third transistor collectors are connected to a constant voltage source while constant current sources supply current to the collectors of the second and fourth transistors.

A differential input voltage applied across the bases of the first and third transistors controls the routing of current of the second and fourth current sources through collector-emitter paths of the first and second Darlington pairs. A differential output current, comprising the difference in collector currents of the Darlington pairs, varies linearly with the differential input signal when the absolute magnitude of the input signal is within a predetermined range. However when the absolute magnitude of the input signal is sufficiently large, the amplifier is "overdriven" such that all of the current of the second and fourth current source passes through one of the first or the second Darlington pairs and the other Darlington pair turns off. As the absolute magnitude of the input signal is further increased, the magnitude of the differential output current remains substantially unchanged.

According to the invention, a biasing circuit forward biases the first diode when the first Darlington pair is on in order to conduct the feedback current between the collector and the base of the second transistor. However when the first Darlington pair is off the biasing circuit reverse biases the first diode so that the emitter of the first Darlington pair is decoupled from the base of the second transistor. This decoupling prevents the second transistor from saturating when the amplifier is overdriven, thereby pulling the second transistor collector potential down to its emitter potential and removing substantial charge from inherent circuit capacitance at the base of the first Darlington pair. Since substantial charge is not removed from this inherent capacitance, the capacitance need not be substantially recharged before the first Darlington pair can turn on when the absolute magnitude of the input signal is decreased to within its normal range. Since capacitance charging is time consuming, a minimal amount of capacitance recharging results in minimal delay between the time the absolute magnitude of the input signal is decreased to a level which permits the first Darlington pair to turn on and the time when the Darlington pair actually does turn on. A similar biasing circuit is provided to forward or reverse bias the second diode in order to selectively couple or decouple the emitter of the second Darlington pair and the base of the third transistor according to whether the second Darlington pair is on or off. The use of the first and second diodes and the associated biasing circuits to decouple the first and second Darlington pair emitters from the second and fourth transistor bases minimizes the recovery time required for the amplifier to return to linear operation from an overdriven state.

It is accordingly an object of the invention to provide an improved differential amplifier which recovers from an overdriven state to linear operation with minimal delay.

The subject matter of the present invention is particularly pointed out and distinctly claimed in the concluding portion of this specification. However, both the organization and method of operation of the invention, together with further advantages and objects thereof, will best be understood by reference to the following description taken in connection with accompanying drawings.

DRAWINGS

DETAILED DESCRIPTION

Figure 1:
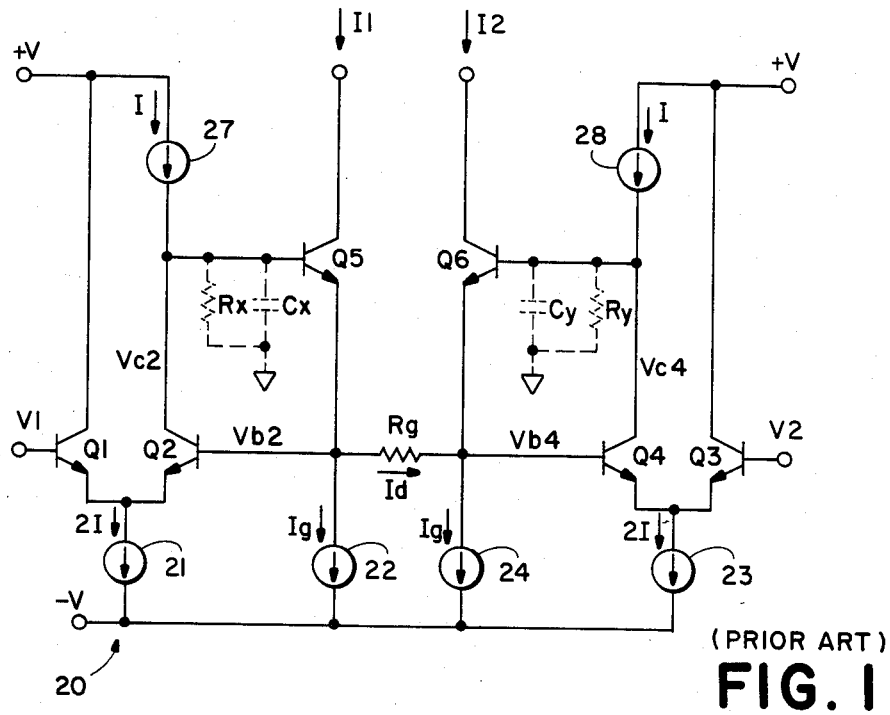
FIG. 1 is a schematic diagram of a differential amplifier of the prior art.

The present invention relates to an improvement in a differential amplifier of the prior art, and it is instructive to first discuss the construction and operation of the prior art amplifier. Referring to FIG. 1, depicting prior art amplifier 20 in schematic diagram form, the amplifier includes a pair of npn transistors Q1 and Q2 having emitters connected to a current source 21 which sinks current from the emitters of transistors Q1 and Q2 and supplies it into a negative voltage source $-V$. (Herein the term "current source" is used to refer to devices which may be thought of as either supplying or sinking constant currents.) The collector of transistor Q1 is directly connected to a positive voltage source $+V$ while the collector of transistor Q2 is coupled to $+V$ through a current source 27 supplying current into the collector of transistor Q2. The collector of transistor Q2 is tied to its base through the base-emitter path of another npn transistor Q5. A further current source 22 sinks current from the junction between the emitter of transistor Q5 and the base of transistor Q2 and supplies the current to the $-V$ voltage source.

Amplifier 20 also includes another pair of npn transistors Q3 and Q4 having emitters connected to a current source 23 sinking current from the emitters of Q3 and Q4 and supplying the current to negative voltage source $-V$. The collector of transistor Q3 is tied to $+V$, the collector of transistor Q4 being connected to $+V$ through a current source 28 supplying current into the collector of transistor Q4. The collector of transistor Q4 is coupled to its base through the base-emitter path of an npn transistor Q6, and a current source 24 connected to $-V$ draws current from the junction between the emitter of transistor Q6 and the base of transistor Q4. The emitters of Q5, and Q6 are intercoupled through a resistor Rg. Current sources 27 and 28 produce currents of magnitude I (suitably 1 mA), current sources 21 and 23 produce currents of magnitude 2*I (suitably 2 mA), and current sources 22 and 24 produce currents of magnitude Ig (suitably 2 mA).

The collector of transistor Q5 supplies an output current I1, with the collector of transistor Q6 providing an output current I2. When an input voltage V1 is applied to the base of transistor Q1 and another input voltage V2 is applied to the base of transistor Q3, a resulting nonzero differential input voltage $V1-V2$ produces a nonzero differential output current $I1-I2$ at the collectors of Q5 and Q6. When the absolute value of differential input voltage $V1-V2$ is maintained within a normal operating range (less than Ig*Rg), amplifier 20 operates in a linear fashion wherein differential output current $I1-I2$ is proportional to differential input voltage $V1-V2$. In this input voltage range, transistors Q1-Q6 are all active, the base voltage Vb2 of transistor Q2 tracks V1, and the base voltage Vb4 of transistor Q4 tracks V2. Note that the emitters of transistors Q1 and Q2 must supply a total current equal to 2*I, the current drawn by current source 21, and current supplied by current source 27 is equal to I (one half the current drawn by current source 21). Neglecting the relatively small base currents supplied to transistors Q5 and Q2, the feedback path provided by the base-emitter junction of transistor Q5 sets the base voltage Vb2 of transistor Q2 to the value which ensures transistor Q2 conducts a collector-emitter current substantially of magnitude I. Since current source 21 draws a current of magnitude 2*I, and since the emitter of transistor Q2 supplies a current of magnitude substantially equal to I, the emitter of transistor Q1 must also supply a current substantially equal to I. Transistors Q1 and Q2 are matched, and inasmuch as they both carry the same load current, and since their emitters are at the same potential, their bases must also be at the same potential, V1. Transistors Q3, Q4 and Q6 operate in a similar fashion to ensure the base voltage Vb4 of transistor Q4 tracks the base voltage V2 of transistor Q3 when the differential input voltage $V1-V2$ is within the normal operating range.

Thus when transistors Q1-Q6 are all active, the potential between the bases of transistor Q2 and transistor Q4 tracks the differential input voltage $V1-V2$ and this potential produces a current Id through resistor Rg equal to $(V1-V2)/Rg$. If differential input voltage $V1-V2$ is zero, Id is zero, and transistor Q5 supplies all of the current (Ig) drawn by current source 22 with transistor Q6 supplying all the current (Ig) drawn by current source 24. The emitter currents of transistors Q5 and Q6 both have magnitude Ig and their collector currents I1 and I2 have magnitudes substantially equal to Ig, less the negligibly small amount of base currents supplied to transistors Q5 and Q6. Since I1 is equal to I2, the differential output current $I1-I2$ of amplifier 20 is zero.

When differential input voltage $V1-V2$ is driven positive, Id has a positive value equal to $(V1-V2)/Rg$, and the emitter of transistor Q5 must not only supply a current of magnitude Ig to current source 22, it must also supply a nonzero current Id through resistor Rg. At the same time, Id flows into current source 24, thus reducing the emitter current of transistor Q6. Thus when differential input voltage $V1-V2$ is positive, the emitter current of transistor Q5, and therefore its collector current I1, are increased by the magnitude of Id, and the emitter current of transistor Q6 and its collector current I2 are decreased by the magnitude of Id. The differential output current $I1-I2$ therefore has a value of 2*Id. Similarly, it can be seen that when differential input voltage $V1-V2$ is driven negative, Id is negative with the collector current I1 of transistor Q5 being decreased by the magnitude of Id and the collector current I2 of transistor Q6 being increased by the magnitude of Id. The differential output current $I1-I2$ still has a value of 2*Id, but in this case is negative because Id is negative.

When differential input voltage $V1-V2$ is sufficiently negative, $-Id$ is equal to Ig and the emitter current of transistor Q6 supplies all of the current required by current sources 22 and 24, a total of 2*Ig. Transistor Q5 has no emitter current and therefore shuts off. Thus the magnitude of I2 is substantially equal to 2*Ig, the magnitude of I1 is 0, and differential output current $I1-I2$ is equal to $-2*Ig$. A further decrease in V1−V2 has no substantial effect on I1 or I2; transistor Q5 is already off and transistor Q6 is already supplying all of the current required by current sources 22 and 24, and a decrease in differential input voltage V1−V2 cannot cause transistor Q5 to produce any less emitter current or cause transistor Q6 to produce any more. After the differential input voltage V1−V2 falls below −Ig, the potential Vb2-Vb4 across Rg is fixed because Id cannot further decrease.

As differential input voltage V1−V2 grows increasingly negative, the base potential Vb2 of transistor Q2 stops tracking V1 and remains constant while its emitter potential falls with V1, thereby causing transistor Q2 to quickly saturate. As transistor Q2 saturates, its collector-emitter potential falls substantially to 0 and the collector of transistor Q2 draws current not only from current source 27 but also from ground through inherent circuit capacitance Cx and inherent circuit resistance Rx coupling the base of transistor Q5 to ground. Capacitance Cx includes the base-emitter capacitance of transistor Q5, the collector-emitter capacitance of transistor Q2 and other inherent circuit capacitances at the base of transistor Q5. Resistance Rx includes the internal resistance of current source 27 as well as resistances to ground through other paths from the base of transistor Q5.

As differential input voltage V1−V2 increases negatively to a point where transistor Q2 supplies all of the current required by current source 21, transistor Q1 shuts off. Transistors Q3, Q4 and Q6 on the opposite side of the amplifier all remain in their normal active operating modes. Thus when differential input voltage V1−V2 is driven to a large negative value, transistors Q1 and Q5 turn off and transistor Q2 saturates. In addition, substantial charge is removed from capacitance Cx due to the drop in collector potential of transistor Q2 as transistor Q2 saturates.

Figure 2:
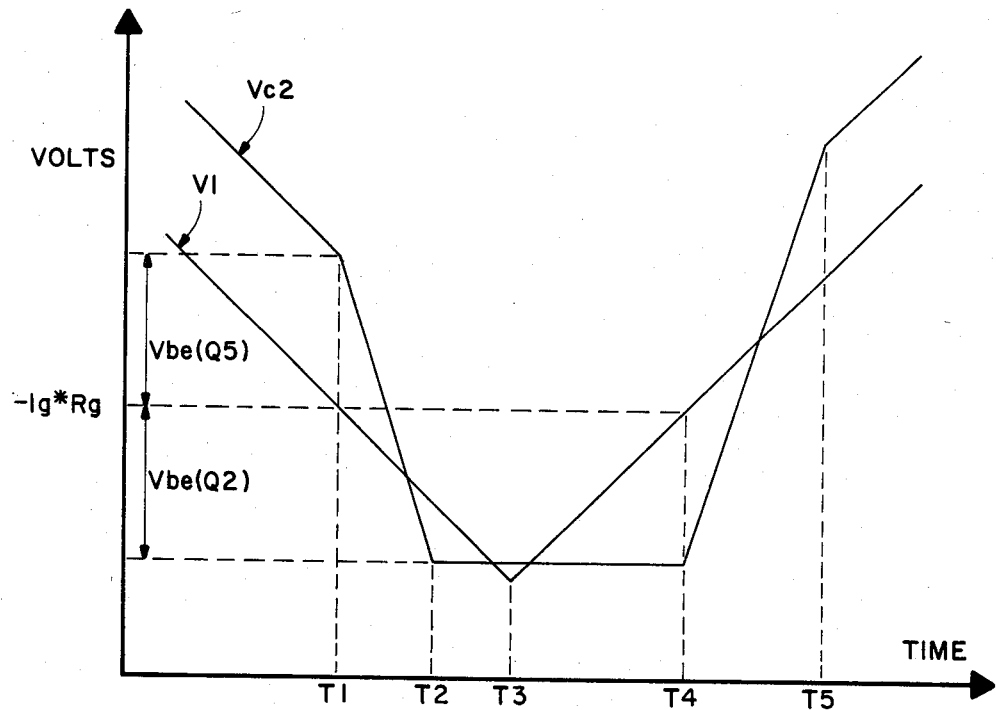
FIG. 2 is a graph showing the time dependent behavior of signals in the differential amplifier of FIG. 1.

FIG. 2 is a graph showing the response of the potential Vc2 at the collector of transistor Q2 when V2 is held, for example, at ground potential while V1 is steadily decreased until the amplifier 20 of FIG. 1 is overdriven, and then steadily increased until amplifier 20 is restored to linear operation. Prior to time T1, the absolute value of differential input voltage V1−V2 is small enough whereby transistors Q1−Q6 are all active. The base potential Vb2 of transistor Q2 tracks V1 and, since transistor Q5 is active, the transistor Q2 collector potential Vc2 is higher than Vb2 by the base-emitter voltage Vbe(Q5) of transistor Q5. Therefore, prior to time T1, Vc2 tracks V1 with an offset equal to Vbe(Q5) and continues to track V1 with this offset as V1 becomes increasingly negative.

At time T1, V1 (which in the present example equals differential input voltage V1−V2 inasmuch as V2 is held at ground potential) has decreased to the value −Ig*Rg, the point at which Id is equal to −Ig. Thereafter, as V1 decreases further, transistor Q2 begins to saturate. Charge on capacitance Cx prevents the transistor Q2 collector voltage Vc2 from dropping abruptly, but as the transistor Q2 collector current discharges Cx, Vc2 falls more rapidly than V1. At time T2 the transistor Q2 collector potential Vc2 has fallen to the transistor Q2 emitter potential which is equal to Vb2 less the base-emitter voltage drop Vbe(Q2) of transistor Q2. Since Vb2 is fixed at −Ig*Rg, Vc2 falls to −(Ig*Rg)−Vbe(Q2). After time T2, as V1 grows increasingly negative, Vc2 remains unchanged because transistor Q1 is off and changes in V1 do not affect the emitter potentials of transistors Q1 and Q2, and because transistor Q2 is saturated and the collector and base of transistor Q2 are fixed at the same potential. The slope of Vc2 in FIG. 2 between times T1 and T2 is primarily a function of the magnitude of the capacitance Cx and the magnitude of 2I, the current of current source 21. The magnitude of resistance Rx is relatively large and does not substantially affect the discharge rate of capacitance Cx.

At time T3, input voltage V1 begins to increase linearly with time. At time T4, V1 has risen to −Ig*Rg, the value at which transistor Q2 starts to come out of saturation, increasing Vc2 so as to turn on transistor Q5. However, in order to increase Vc2, the charge removed from Cx between times T1 and T2 must be restored, and this occurs between times T4 and T5. After time T5, the transistor Q2 collector potential Vc2 again follows V1, transistor Q5 is active, and the amplifier resumes linear operation. With negligible capacitance Cx between the base of transistor Q5 and ground, the transistor Q2 collector potential Vc2 would abruptly jump to −Ig*Rg.Vbe(Q5) at time T4, transistor Q5 would immediately turn on, and amplifier 20 would immediately resume linear operation. However, since Cx is nonzero, amplifier 20 requires a certain amount of time (T5−T4) to recover from the overdriven state once V1 has risen to the minimum value −Ig*Rg for which amplifier 20 normally operates in a linear fashion.

Figure 3:
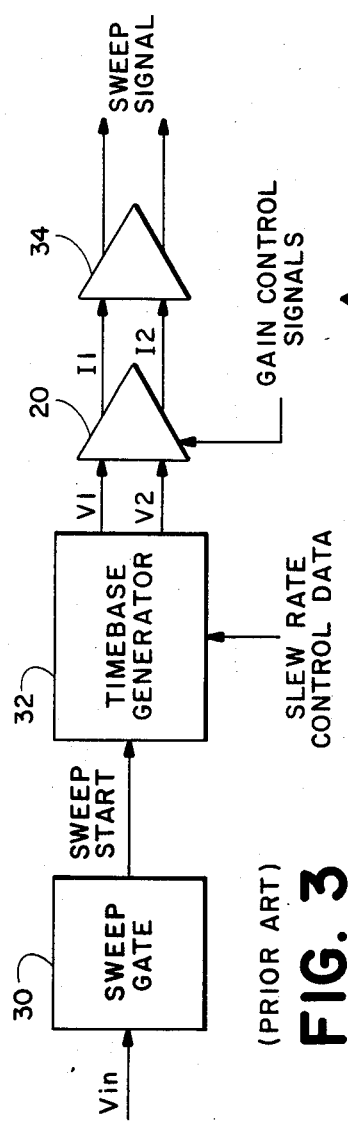
FIG. 3 is a block diagram of a prior art oscilloscope time base circuit utilizing the differential amplifier of FIG. 1.

FIG. 3 is a block diagram of a time base circuit for an oscilloscope utilizing amplifier 20 of FIG. 1. An input voltage Vin is applied to a sweep gate circuit 30 producing a sweep start signal at a time suitably determined according to when the Vin voltage reaches a predetermined trigger level. The sweep start signal is applied to a time base generator 32 which supplies the V1 and V2 voltages applied as inputs to amplifier 20. The I1 and I2 output currents of amplifier 20 are provided as inputs to a transresistance amplifier 34 supplying a differential sweep signal for controlling the horizontal position of an electron beam on an oscilloscope cathode ray tube screen. The time base generator may also, in some circuit configurations, supply only the V1 voltage as the input to amplifier 20. V2 can be supplied from another source. The voltage of the sweep signal is proportional to the differential output current I1−I2 of amplifier 20. In response to the sweep start signal, time base generator 32 drives differential input voltage V1−V2 from a negative value (−VA) to a positive value (+VA) with a slew rate set according to slew rate control data supplied to the time base generator. In response to differential input voltage V1−V2, amplifier 20 drives differential output current I1−I2 from a negative value to a positive value and this change in differential output current I1−I2 causes amplifier 34 to drive the sweep signal from a negative value to a positive value, thereby "sweeping" the beam across the screen. Time base generator 32 then resets differential input voltage V1−V2 to −VA and waits for another sweep start signal from the sweep gate 30 before driving differential input voltage V1−V2 positive again.

The sweep speed of the beam across the oscilloscope screen is controlled by the rate of increase of differential output current I1−I2, and when the amplifier 20 is operating in a linear fashion, the rate at which I1−I2 increases is proportional to the rate of increase of differential input voltage V1−V2 as well as to the gain of amplifier 20, the gain being defined as (I1−I2)/(V1−V2). To obtain the highest sweep speed, the slew rate control data input to timebase generator 32 is set to provide a maximum slew rate for differential input voltage V1−V2 with the gain of amplifier 20 adjusted to a maximum value. Referring to FIG. 1, the gain of amplifier 20 is proportional to Ig and inversely proportional to Rg, and therefore the gain can be increased by increasing Ig or decreasing Rg. Gain control is usually accomplished by providing current sources of various magnitudes and resistors of various magnitudes which may be alternatively connected to amplifier 20 as current sources 22 and 24, and as resistor Rg, by means of switches controlled via externally generated gain control signals.

Figure 4:
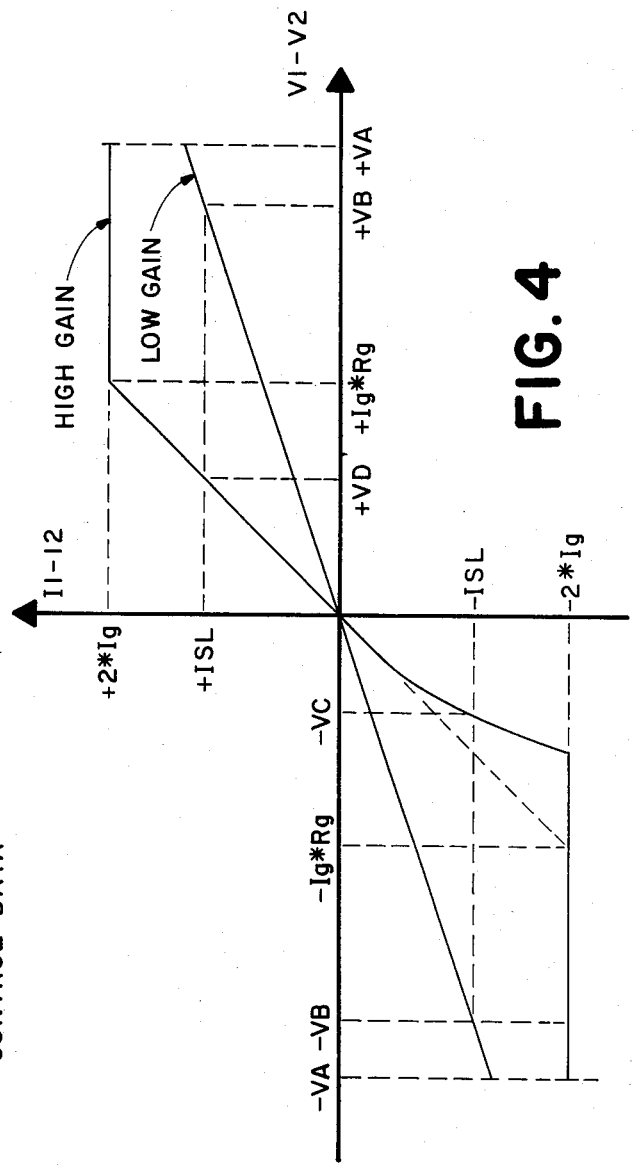
FIG. 4 is a graph showing the response of an output signal of the prior art differential amplifier of FIG. 1 to an input signal.

FIG. 4 is a graph depicting the behavior of differential output current I1−I2 in response to V1−V2 for two different gain settings of amplifier 20. When the gain setting is low, the amplifier is not overdriven for a particular range of differential input voltage V1−V2 (−VA to +VA) supplied by time base generator 32 and the differential output current I1−I2 rises linearly with the differential input voltage V1−V2 as V1−V2 rises from −VA to +VA. When V1−V2 reaches a voltage −VB, the differential output current I1−I2 has a magnitude −ISL required to cause the horizontal amplifier 34 to produce a sweep signal magnitude sufficient to position the beam at the left edge of the oscilloscope screen. When differential input voltage V1−V2 reaches +VB, the differential output current I1−I2 is the magnitude +ISL required to cause the horizontal amplifier 34 to produce a sweep signal sufficient to position the beam at the right edge of the screen. Since differential input voltage V1−V2 rises linearly with time, since differential output current I1−I2 rises linearly with differential input voltage V1−V2, and since the sweep signal is proportional to differential output current I1−I2, the sweep signal rises linearly with time and the beam moves with a constant speed across the screen.

When the gain of amplifier 20 is set high, the initial value −VA of differential input voltage V1V2 overdrives amplifier 20 such that differential output current I1−I2 is driven to −2*Ig. Transistor Q2 of FIG. 1 is saturated, capacitance Cx is discharged, and transistor Q5 is off. As differential input voltage V1−V2 rises above −Ig*Rg, transistor Q2 begins to unsaturate and charge is supplied to capacitance Cx. As capacitance Cx charges, transistor Q5 begins to turn on, increasing I1. When differential input voltage V1−V2 reaches a value −VC, differential output current I1−I2 has risen to −ISL, sufficient to position the beam at the left edge of the screen. As differential input voltage V1−V2 increases toward a value +VD, differential output current I1−I2 rises toward +ISL and the beam moves to the right edge of the screen. As differential input voltage V1−V2 continues to rise beyond +Ig*Rg, amplifier 20 is overdriven and differential output current I1−I2 reaches its upper limit +2*Ig.

Note that for the high gain response, the relationship between differential output current I1−I2 and differential input voltage V1−V2 is not linear for all values of differential output current I1−I2 between −ISL and +ISL. The non-linearity during the initial portion of the rise in V1−V2 results from the delay in turning on transistor Q5 of amplifier 20 due to the charging time required by capacitance Cx. Since the beam sweeps across the screen as differential output current I1−I2 rises from −ISL to +ISL, the sweep rate of the beam (proportional to the slope of the high gain curve of FIG. 4) is not constant and a waveform display created utilizing such a sweep signal to control horizontal beam position would be distorted.

According to the present invention, the prior art differential amplifier 20 of FIG. 1 is modified to form an improved differential amplifier adapted to minimize the time required for recovery from the overdriven state. The improved differential amplifier 40 is depicted in schematic diagram form in FIG. 5. In modifying amplifier 20 of FIG. 1 to form the improved differential amplifier 40 of FIG. 5, transistors Q5 and Q6 are replaced with Darlington pairs Q5' and Q6'. FIG. 6 is a schematic diagram of a Darlington pair suitable for use as Q5' or Q6'. The Darlington pair of FIG. 6 is formed by two npn transistors Q9 and Q10; the collectors of transistors Q9 and Q10 are connected together and the emitter of transistor Q9 is connected to the base of transistor Q10. The base of transistor Q9 comprises the "base" of the Darlington pair, the collectors of transistor Q9 and transistor Q10 comprise the "collector" of the Darlington pair, and the emitter of transistor Q10 comprises the "emitter" of the Darlington pair.

Figure 5:
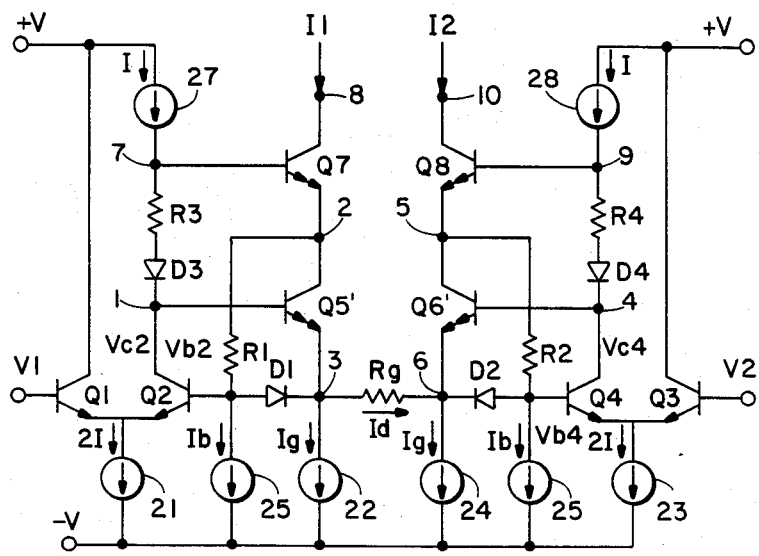
FIG. 5 is a schematic diagram of an improved differential amplifier according to the present invention.
Figure 6:
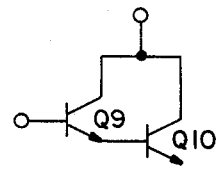
FIG. 6 is a schematic diagram of a Darlington pair suitable for use in the improved differential amplifier of FIG. 5.

In addition to replacing transistors Q5 and Q6 of amplifier 20 with Darlington pairs Q5' and Q6' to form amplifier 40 of FIG. 5, a diode D1 is inserted between the base of transistor Q2 and the emitter of Darlington pair Q5' (node 3). Also a diode D2 is inserted between the base of transistor Q4 and the emitter of Darlington pair Q6' (node 6). An additional current source 25 is connected between the base of transistor Q2 and −V, supplying current of magnitude Ib to −V, and a similar current source 26 is connected between the base of transistor Q4 and −V, supplying a current of magnitude Ib to −V. A resistor R1 is provided to couple the collector of Darlington pair Q5' (node 2) and the base of transistor Q2, while another resistor R2 is provided to couple the collector of Darlington pair Q6' (node 5) and the base of transistor Q4. A resistor R3 and a diode D3 are inserted in series between current source 27 (node 7) and the collector of transistor Q2 (node 1), with a resistor R4 and a diode D4 being inserted in series between current source 28 (node 9) and the collector of transistor Q4 (node 4). An additional Darlington pair Q7 is provided with its emitter connected to the collector of Darlington pair Q5' (node 2) and its base connected to node 7 such that output current I1 is produced at the collector of Darlington pair Q7 (node 8) rather than at the collector of Darlington pair Q5'. Similarly, a Darlington pair Q8 has its emitter connected to the collector of Darlington pair Q6' (node 5) and its base connected to node 9, output current I2 being produced at the collector of Darlington pair Q8 (node 10) rather than at the collector of Darlington pair Q6'. Darlington pairs Q7 and Q8 are similar to Darlington pairs Q5' and Q6'.

When amplifier 40 of FIG. 5 is not overdriven by an excessively large (positive or negative) differential input voltage V1−V2, transistors Q1−Q4, Darlington pairs Q5', Q6', Q7 and Q8 are all active, neither saturated nor cut off. Since the base currents supplied to Darlington pairs Q5' and Q7 are small, substantially all of the current produced by current source 27 passes through resistor R3 and diode D3. The potential between the bases of Darlington pairs Q7 and Q5' (nodes 7 and 1) remains substantially constant despite variation in differential input voltage V1−V2. The potential of node 2 follows the potential of node 7, offset by the base-emitter voltage of Darlington pair Q7, while the potential of node 3 follows the potential node 1, offset by the base-emitter voltage of Darlington pair Q5'. Darlington pairs Q5' and Q7 have matching characteristics. Therefore the potential between the emitter of Darlington pair Q7 and the emitter of Darlington pair Q5' (nodes 2 and 3) is equal to the potential between the bases of Darlington pairs Q7 and Q5' (nodes 7 and 1). Inasmuch as resistor R1 and diode D1 are connected between nodes 2 and 3, the total potential across resistor R1 and diode D1 is equal to the total potential across resistor R3 and diode D3. Diodes D1 and D3 have similar forward bias voltage drops and therefore the potential across resistor R1 is equal to the potential across resistor R3 when both diodes are forward biased.

The relative magnitudes of resistors R3 and R1 and currents Ib and I are selected such that Ib*R1 is slightly less than I*R3 (suitably by 0.25 V.) whereby current must be drawn through resistor R1 and diode D1 by current source 22 in order to ensure the potential drop across resistor R1 matches the potential drop across resistor R3. This current forward biases diode D1. Similarly, it can be shown that when amplifier 40 is not overdriven, diode D2 is also forward biased when the magnitudes of I, Ib, R2 and R4 are selected such that Ib*R2 is slightly less than I*R4.

When diode D1 is forward biased, it couples the emitter of Darlington pair Q5' to the base of transistor Q2 to complete a feedback path from the collector of transistor Q2 to its base via the base-emitter junction of Darlington pair Q5' and diode D1. Transistors Q1 and Q2 are similar and each must supply current of magnitude I to current source 21. Since the base voltage of transistor Q1 is V1, the base voltage of transistor Q2 must also be V1 which is ensured by the feedback provided by Darlington pair Q5' and diode D1. Inasmuch as diode D1 is forward biased, the potential of node 3 is V1-VD, where VD is the magnitude of the forward bias voltage across diode D1. Similarly when diode D2 is forward biased, it couples node 6 to the base of transistor Q4 thereby completing a feedback path from the collector of transistor Q4 to its base via the base-emitter junction of Darlington pair Q6' and diode D2, causing the transistor Q4 base potential to track V2. Since diode D2 is forward biased, the potential of node 6 is V2-VD, wherein VD is also the magnitude of the forward bias voltage across diode D2, diodes D1 and D2 having matching forward bias voltage drops.

Therefore when amplifier 40 is not overdriven, the potential across resistor Rg is equal to the difference between the potential at node 3 (V1-VD) and the potential at node 6 (V2-VD), which potential difference is equal to differential input voltage V1−V2. The current Id through resistor Rg caused by an imbalance in V1 and V2 causes an imbalance in the emitter currents supplied by Darlington pairs Q5' and Q6' to current sources 22 and 24, and this emitter current imbalance in turn causes a similar imbalance in the collector currents of Darlington pairs Q5' and Q6', as well as in the collector currents I1 and I2 of Darlington pairs Q7 and Q8. Thus the differential output current I1−I2 of amplifier 40 is proportional to differential input voltage V1−V2 over the range of differential input voltage V1−V2 for which amplifier 40 is not overdriven.

Amplifier 40 is overdriven when the absolute value of the differential input voltage |V1−V2| exceeds Ig*Rg. For example, when (V1−V2)/Rg falls to −Ig, Darlington pair Q5' turns off because all of the current required by current source 22 is supplied via Darlington pair Q6'. Darlington pair Q7 does not turn off because it must continue to supply current through resistor R1 of magnitude Ib drawn by current source 25. As the differential input voltage V1−V2 falls below −Ig*Rg, the potential at node 3 remains fixed since Darlington pair Q6' can supply no more current through resistor Rg. As the base potential of transistor Q2 continues to fall, diode D1 becomes reverse biased, decoupling the emitter of Darlington pair Q5' (node 3) from the base of transistor Q2. Diode D3, resistor R3, Darlington pair Q7 and resistor R1 provide feedback from the collector of transistor Q2 to its base which prevents transistor Q2 from saturating as differential input voltage V1−V2 decreases. Since transistor Q2 does not saturate, its collector potential is not pulled down to its emitter potential and therefore no substantial charge is removed from inherent circuit capacitance at the base of Darlington pair Q5' as (V1−V2)/Rg falls below −Ig. Accordingly, when differential input voltage V1−V2 is subsequently increased above −Ig, no substantial charge must be supplied to this inherent circuit capacitance in order to turn on Darlington pair Q5', and delay in restoring the amplifier 40 to linear operation is minimized.

Figure 7:
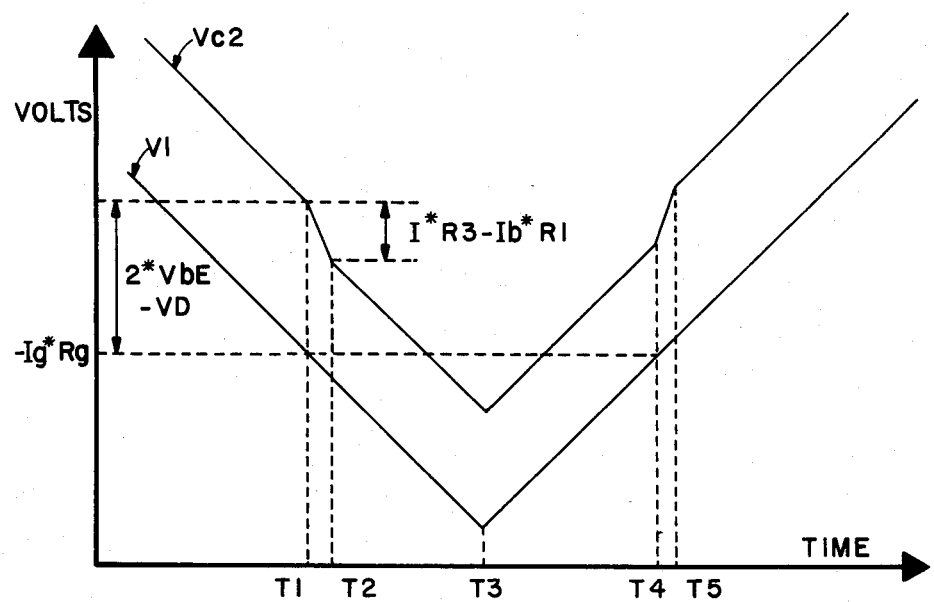
FIG. 7 is a graph showing the time dependent behavior of signals in the improved differential amplifier of FIG. 5.

FIG. 7 is a graph showing the response of the potential Vc2 at the collector of transistor Q2 of amplifier 40 of FIG. 5 when V2 is held at ground potential while V1 is steadily decreased so as to overdrive amplifier 40, and then steadily increased to restore the amplifier to linear operation. Prior to time T1, the absolute value of differential input voltage V1−V2 is small enough that all transistors and Darlington pairs of amplifier 40 are active. The base potential Vb2 of transistor Q2 is equal to V1 and, since transistor Q5 is active, the transistor Q2 collector potential Vc2 is higher than Vb2 by the two base-emitter voltage drops (Vbe) of the two transistors comprising Darlington pair Q5' offset by the voltage drop VD across diode D1. At time T1, V1 (which in the present example equals differential input voltage V1−V2 since V2 is held at ground potential) has decreased to the value −Ig*Rg, and Id is equal to −Ig. Thereafter, as V1 decreases further, diode D1 becomes reverse biased, the potential difference between Vc2 and V1 begins to fall, and inherent capacitance at the base of Darlington pair Q5' begins to discharge. However, diode D3, resistor R3, Darlington pair Q7 and resistor R1 provide feedback between the collector and base of transistor Q2 which acts in concert with current source 25 to continue to pull down the base of transistor Q2 (no longer coupled to node 3 through diode D1) so that the transistor Q2 base continues to follow V1, preventing transistor Q2 from becoming saturated.

By time T2 the feedback through resistor R1 halts the decline in potential difference between the base of transistor Q2 and its collector, and the collector potential Vc2 begins to track the base potential but with an offset equal to the sum of 2*Vbe (the two base-emitter potential drops associated with Darlington pair Q7) and the voltage drop Ib*R1 across resistor R1, less the voltage drop VD across diode D3 and the voltage drop I*R3 across resistor R3. Thus the decline in transistor Q2 collector potential Vc2 with respect to V1 caused by overdriving amplifier 40 is limited to (I*R3)−(Ib*R1). This decline in collector potential with respect to V1 would be zero if Ib*R1 were equal to I*R3; however, I*R3 must exceed Ib*R1 by a small amount (such as 0.25 volts) in order to ensure diode D1 is forward biased when amplifier 40 is not overdriven.

At time T3, V1 begins to increase, and at time T4, V1 reaches −Ig*Rg, the point where Darlington pair Q5' begins to turn on. Inasmuch as the capacitance at the base of Darlington pair Q5' was not greatly discharged when amplifier 40 was overdriven, very little time is required to recharge the capacitance, and therefore Darlington pair Q5' turns on quickly after differential input voltage V1−V2 reaches −Ig*Rg and amplifier 40 quickly resumes linear operation at time T5. Note that the recovery time (T5−T4) for amplifier 40 as shown in FIG. 6 is much smaller than the recovery time (T5−T4) for amplifier 20 as shown in FIG. 2.

Figure 8:
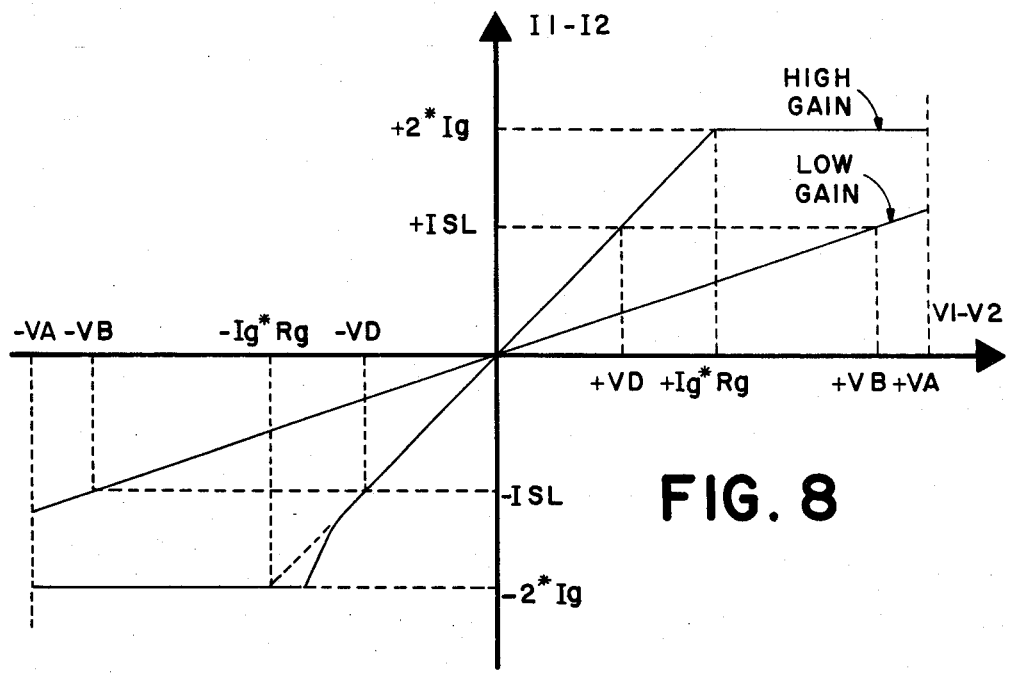
FIG. 8 is a graph showing the response of an output signal of the improved differential amplifier of FIG. 5 to an input signal.

The benefit of the fast recovery time of amplifier 40 becomes apparent when the improved amplifier 40 of FIG. 5 is substituted for the prior art amplifier 20 in the oscilloscope time base circuit of FIG. 4. FIG. 8 is a graph of the behavior of the differential output current I1−I2 of amplifier 40 in response to the differential input voltage V1−V2 for two different gain settings of amplifier 40 (i.e. two different combinations of Ig*Rg). The low gain response of amplifier 40 shown in FIG. 8 is similar to the low gain response of amplifier 20 shown in FIG. 4. However, with respect to the high gain response, the fast recovery time of amplifier 40 permits linear operation to begin before the differential input voltage V1−V2 reaches −VD, the point at which the differential output current I1−I2 reaches −ISL, rather than afterwards, so that the sweep signal produced by amplifier 34 of FIG. 3 in response to differential output current I1−I2 has a constant rate of change as it moves the beam across the screen.

According to the present invention, diode D1 of the improved amplifier 40 of FIG. 5 is forward biased when (V1−V2) is greater than −Ig*Rg, coupling the emitter of Darlington pair Q5' to the base of transistor Q2 whereby the potential of node 3 follows V1. However, diode D1 is reverse biased when V1−V2 falls below −Ig*Rg, decoupling the base of transistor Q2 from node 3 to prevent transistor Q2 from becoming saturated. Similarly diode D2 is forward biased when (V1−V2) is less than +Ig*Rg, thereby coupling the emitter of Darlington pair Q6' to the base of Q4 such that the potential of node 6 follows V2, and diode D2 is reverse biased when differential input voltage V1−V2 rises above +Ig*Rg, thereby decoupling the base of transistor Q4 from node 6 and preventing transistor Q4 from becoming saturated. As a result of the use of diodes D1 and D2, along with diodes D3 and D4, resistors R3 and R4, Darlington pairs Q7 and Q8, and current sources 25 and 26 which provide appropriate biasing for diodes D1 and D2, the time required by amplifier 40 to recover from an overdriven condition to linear operation is minimized.

Referring to FIG. 5, for proper operation of the amplifier 40 when the amplifier is not overdriven, the potential of the collector of transistor Q2 should exceed the potential of its base. Node 3 is at a lower potential than the base of transistor Q2 due to the drop across diode D1 and therefore the potential rise from node 3 to the collector of transistor Q2 must exceed the voltage drop across diode D1. If Darlington pair Q5' were to be implemented as a single transistor instead of a Darlington pair, the base-emitter voltage of Darlington pair Q5' may not exceed the voltage VD across diode D1, which may be similar to the base-emitter voltage of a transistor particularly when the transistor and diode are implemented in the same integrated circuit. However the base-emitter voltage of the Darlington pair Q5' is equal to two single transistor base-emitter voltages, thereby ensuring the Q5 base-emitter voltage exceeds the potential across forward biased diode D1. Nonetheless, the function of Darlington pair Q5' could be implemented with a single transistor having a sufficiently large base-emitter voltage, or by a single transistor having an additional diode inserted between its emitter and node 3 to provide additional voltage increase between node 3 and the collector of transistor Q2. Similarly Darlington pairs Q6', Q7 and Q8 could be implemented utilizing single transistors, each having a diode in series with is emitter.

While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

We claim:
1. An amplifier comprising:
first, second, and third nodes;
first and second current sources;
first means for conducting current between said second and third nodes and between said first and third nodes according to a first potential difference between said first and third nodes;
first and second transistors each having an emitter terminal, a base terminal and a collector terminal, the collector terminal of said second transistor being coupled to said first node, the emitter terminals of said first and second transistors being coupled to said first current source, and the base terminal of said second transistor being coupled to said second current source;
resistor means having a first end connected to the base terminal of said second transistor and having a second end;
second means for coupling said third node and the base terminal of said second transistor when a second potential difference between the base terminal of said second transistor and said third node is of a first polarity and for decoupling said third node and the base terminal of said second transistor when said second potential difference is of a second polarity; and
third means for maintaining a constant potential between the first node and the second end of said resistor means

2. The amplifier according to claim 1 wherein said first means comprises a Darlington pair having a base terminal connected to said first node, a collector terminal connected to said second node, and an emitter terminal connected to said third node.

3. The amplifier according to claim 1 wherein said second means comprises a diode connected between the base terminal of said second transistor and said third node.

4. The amplifier according to claim 1 wherein the second end of said resistor means is connected to said second node.

5. The amplifier according to claim 4 wherein said third means comprises:
a fourth and a fifth node;
means for maintaining a substantially constant potential between said first and fourth nodes; and means for conducting current between said fifth and second nodes according to a third potential difference between said fourth and second nodes.

6. The amplifier according to claim 5 wherein said means for maintaining a substantially constant potential between said first and fourth nodes comprises:
a resistor;
a diode connected in series with said resistor between said first and fourth nodes; and
a third current source connected to said fourth node.

7. An amplifier comprising:
first, second, third, fourth, fifth, and sixth nodes, said sixth node being resistively coupled to said third node;
first means for conducting currents between said second and third nodes and between said first and third nodes according to a first potential difference between said first and third nodes and for conducting currents between said fifth and sixth nodes and between said fourth and sixth nodes according to a second potential difference between said fourth and sixth nodes;
first, second, third, fourth, fifth and sixth current sources, said second current source being connected to said third node and said fourth current source being connected to said sixth node;
first and second transistors each having an emitter terminal, a base terminal and a collector terminal, the collector terminal of said second transistor being coupled to said first node, the emitter terminals of said first and second transistors being coupled to said first current source, and the base terminal of said second transistor being coupled to said fifth current source;
third and fourth transistors each having an emitter terminal, a base terminal and a collector terminal, the collector terminal of said fourth transistor being coupled to said fourth node, the emitter terminals of said third and fourth transistors being coupled to said third current source, and the base terminal of said fourth transistor being coupled to said sixth current source;
first resistor means having a first end connected to the base terminal of said second transistor and having a second end;
second resistor means having a first end connected to the base terminal of said fourth transistor and having a second end;
second means for coupling said third node and the base terminal of said second transistor when a third potential difference between the base terminal of said second transistor and said third node is of a first polarity and for decoupling said third node and the base terminal of said second transistor when said third potential difference is of a second polarity;
third means for coupling said sixth node and the base terminal of said fourth transistor when a fourth potential difference between the base terminal of said fourth transistor and said sixth node is of a first polarity and for decoupling said sixth node and the base terminal of said fourth transistor when said fourth potential difference is of a second polarity;
fourth means for maintaining a first substantially constant potential between the first node and the second end of said first resistor means; and fifth means for maintaining a second substantially constant potential between the fourth node and the second end of said second resistor means.

8. The amplifier according to claim 7 wherein said first means comprises a Darlington pair having a base terminal connected to said first node, a collector terminal connected to said second node, and an emitter terminal connected to said third node.

9. The amplifier according to claim 7 wherein said second means comprises a diode connected between the base terminal of said second transistor and said third node.

10. The amplifier according to claim 7 wherein the second end of said first resistor means is connected to said second node.

11. The amplifier according to claim 10 wherein said fourth means comprises:
a seventh node;
an eighth node;
means for maintaining a third substantially constant potential between said first and seventh nodes; and
means for conducting current between said seventh and second nodes according to a fifth potential difference between said seventh and second nodes.

12. The amplifier according to claim 11 wherein said means for maintaining a third substantially constant potential comprises:
a resistor;
a diode connected in series with said resistor between said first and seventh nodes; and
a seventh current source connected to said seventh node.

13. An amplifier comprising:
first, second, third, fourth, fifth, sixth, seventh, eighth, ninth and tenth nodes, said sixth node being resistively coupled to said third node;
first means for conducting currents between said second and third nodes and between said first and third nodes according to a first potential difference between said first and third nodes, for conducting currents between said fifth and sixth nodes and between said fourth and sixth nodes according to a second potential difference between said fourth and sixth nodes, for conducting currents between said seventh and second nodes and between said eighth and second nodes according to a third potential difference between said seventh and second nodes, and for conducting currents between said tenth and fifth nodes and between said ninth and fifth nodes according to a fourth potential difference between said ninth and fifth nodes;
first, second, third, fourth, fifth, and sixth current sources, said second current source being connected to said third node and said fourth current source being connected to said sixth node;
first and second transistors each having an emitter terminal, a base terminal and a collector terminal, the collector terminal of said second transistor being coupled to said first node, the emitter terminals of said first and second transistors being coupled to said first current source, and the base terminal of said second transistor being coupled to said fifth current source and resistively coupled to said second node;
third and fourth transistors each having an emitter terminal, a base terminal and a collector terminal, the collector terminal of said fourth transistor being coupled to said fourth node, the emitter terminals of said third and fourth transistors being coupled to said third current source, and the base terminal of said fourth transistor being coupled to said sixth current source and resistively coupled to said fifth node;

second means for coupling said third node and the base terminal of said second transistor when a fifth potential difference between the base terminal of said second transistor and said third node is of a first polarity and for decoupling said third node and the base terminal of said second transistor when said fifth potential difference is of a second polarity;

third means for coupling said sixth node and the base terminal of said fourth transistor when a sixth potential difference between the base terminal of said fourth transistor and said sixth node is of a first polarity and for decoupling said sixth node and the base terminal of said fourth transistor when said sixth potential difference is of a second polarity;

fourth means for maintaining a first substantially constant potential between the first and seventh nodes; and fifth means for maintaining a second substantially constant potential between the fourth and ninth nodes.

14. The amplifier according to claim 13 wherein said second means comprises a diode connected between the base terminal of said second transistor and said third node.

15. The amplifier according to claim 13 wherein said means for maintaining a first substantially constant potential between said first and seventh nodes comprises:
a resistor;
a diode connected in series with said diode between said first and seventh nodes; and
a seventh current source connected to said seventh node.

* * * * *